United States Patent [19]

Takeoka et al.

[11] Patent Number: 4,663,008
[45] Date of Patent: May 5, 1987

[54] METHOD OF PRODUCING AN OPTICAL INFORMATION RECORDING MEDIUM

[75] Inventors: Yoshikatsu Takeoka; Norio Ozawa, both of Kawasaki; Nobuaki Yasuda, Zushi, all of Japan

[73] Assignee: Kabushiki Kaisha Toshiba, Kawasaki, Japan

[21] Appl. No.: 885,738

[22] Filed: Jul. 21, 1986

Related U.S. Application Data

[63] Continuation of Ser. No. 643,702, Aug. 24, 1984, abandoned.

[30] Foreign Application Priority Data

Aug. 31, 1983 [JP] Japan .................................. 58-157722
Aug. 31, 1983 [JP] Japan .................................. 58-157723

[51] Int. Cl.$^4$ .............................................. C23C 14/40
[52] U.S. Cl. ............................ 204/192.26; 204/192.15
[58] Field of Search ....................... 204/192 C, 192 P

[56] References Cited

U.S. PATENT DOCUMENTS 4,362,936 12/1982 Hofmann et al. .................... 250/292
4,414,085 11/1983 Wickersham .................... 204/192 C

FOREIGN PATENT DOCUMENTS 0062975 10/1982 European Pat. Off. .
2750611 5/1978 Fed. Rep. of Germany .
57-165292 10/1982 Japan .

OTHER PUBLICATIONS

J. Appl. Polym. Sci., vol. 17, (1973), H. Kobayashi, A. T. Bell, and M. Shen, p. 887.
Thin Solid Films, vol. 107, No. 1, Sep. 1983, Lausanne, CH; J. A. Thornton, "Plasma-Assisted Deposition Processes: Theory Mechanisms and Applications", pp. 3-19.
Thin Solid Films, vol. 97, No. 4, Nov. 1982, Lausanne, CH; S. Craig et al., "Structure, Optical Properties and Decomposition Kinetics of Sputtered Hydrogenated Carbon", pp. 345-361.
Thin Solid Films, vol. 107, No. 1, Sep. 1983; Lausanne, CH; R. F. Bunshah, "Processes of the Activated Reactive Evaporation Type and Their Tribological Applications".

Primary Examiner—John F. Niebling
Assistant Examiner—William T. Leader
Attorney, Agent, or Firm—Oblon, Fisher, Spivak, McClelland & Maier

[57] ABSTRACT

An optical information recording medium is produced by introducing a plasma-generation gas comprising hydrocarbon into a plasma-generating region provided with a metal target and a substrate. The pressure of the plasma-generating gas is maintained within a predetermined range within the plasma-generating region. Electrical power is applied to the plasma-generating gas to dissociate the gas thereby forming a plasma. The generated plasma sputters the metal target, thereby allowing the sputtered metal to be deposited on the substrate in the form of a film containing the metal and the carbon liberated from the hydrocarbon. During sputtering, the product between the density of the power applied to the electrode and the average residence time of the plasma-generating gas within the plasma-generating region is controlled within such that the product falls within the range of more than 0.5 W-sec/cm$^2$ and less than 50 W-sec/cm$^2$, and the partial pressure of a secondary hydrocarbon, which is different from the introduced hydrocarbon, present during the dissociation to the secondary hydrocarbon before the dissociation and after the introduction is set to range between 2 and 12.

17 Claims, 7 Drawing Figures

F I G. 1
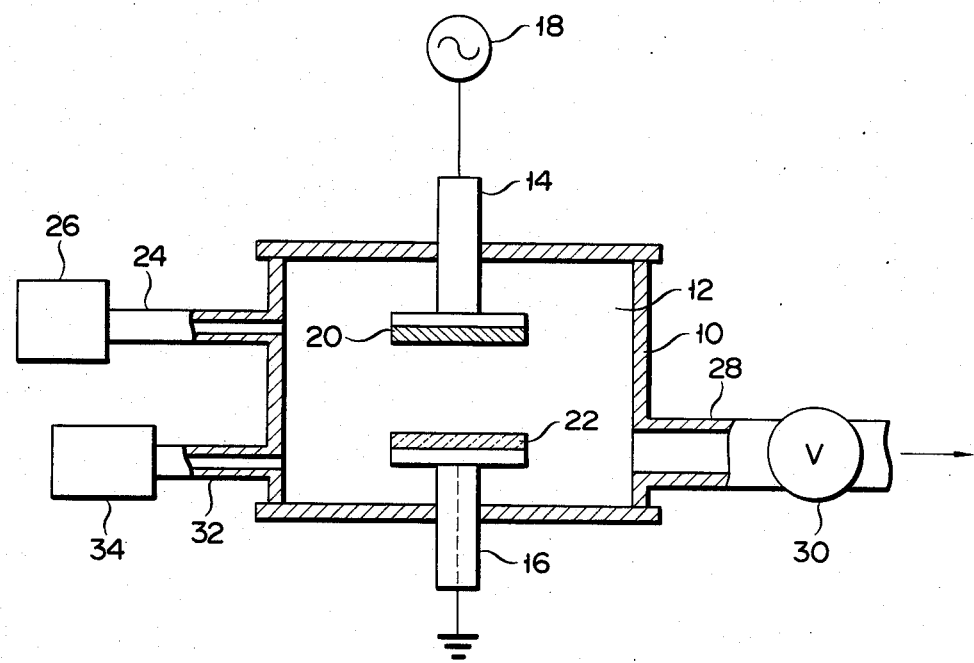

METHOD OF PRODUCING AN OPTICAL INFORMATION RECORDING MEDIUM

This application is a continuation of application Ser. No. 643,702, filed Aug. 24, 1984 now abandoned.

BACKGROUND OF THE INVENTION

1. Field of the Invention

The present invention relates to a method of producing an optical information recording medium in which information is recorded on the basis of a chemical change caused by laser beam irradiation.

2. Description of the Prior Art

Recently, vigorous research has been made on information recording by laser beam irradiation because the recording mentioned permits a very high recording density during actual time recording. A known optical information recording medium is produced by forming a thin calcogen film such as tellurium, a thin pigment film, etc. on a transparent resin substrate. However, a serious problem remains unsolved in the recording medium of this type. Specifically, the recording medium deteriorates during storage by the oxygen or water contained in the air or by the influence of ultraviolet light.

To overcome the defect noted above, a recording medium comprising a thin tellurium (Te) film containing carbon has been proposed in Japanese Patent Disclosure (Kokai)No. 57-165292. In this case, a Te target is sputtered by a hydrocarbon gas plasma so as to deposit on a substrate a Te layer containing the carbon separated from the hydrocarbon.

The sputtering technique is generally thought to utilize a plasma of rare gases such as argon gas as the sputtering gas. In other words, the use of a plasma gas highly reactive with the target metal or a decomposable gas such as hydrocarbon gas as in the Japanese Specification quoted previously is quite exceptional in its sputtering technique. In the case of using a decomposable gas, the decomposing process of the gas is greatly influenced by the power applied for generating a plasma from the decomposable gas, the plasma gas pressure in the step of forming a metal film, and the flow rate of the decomposable gas in the step of introducing the gas into the plasma-generating region, leading to marked changes in the characteristics of the resultant recording film. In addition, the conditions for forming a recording film depend on the type of sputtering apparatus used. It follows that it is necessary to conduct experiments many times in order to determine the optimum film-forming conditions for each sputtering apparatus.

SUMMARY OF THE INVENTION

An object of the present invention is to provide a method of producing an optical information recording medium, wherein a metal target is sputtered by a sputtering gas of hydrocarbon, i.e., a decomposable gas, so as to form an information recording film consisting of the sputtered metal on a substrate, and which permits a stable forming of the information recording film regardless of the type of sputtering apparatus used.

In the first step of the method of the present invention, a plasma-generating gas comprising hydrocarbon is introduced into a plasma-generating region in which a metal target and a substrate are provided. Power is applied to the introduced gas so as to dissociate the hydrocarbon and, thus, to generate a plasma from the plasma-generating gas. The metal target is sputtered by the resultant plasma gas, with the result that the metal sputtered from the target is deposited together with the carbon liberated from the hydrocarbon on the substrate to form a film. In the present invention, the product between the power density applied to the metal target and the average residence time of the plasma-generating gas in the plasma-generating region is defined to fall within the range of more than 0.5 W-sec/cm$^2$ and less than 50 W-sec/cm$^2$. Under this condition, the ratio of partial pressure of a second hydrocarbon which is different from the introduced hydrocarbon and present during discharge to the partial pressure of the second hydrocarbon detected before discharge within the plasma-generating region ranges between 2 and 12. In other words, the product between the power density and the average residence time mentioned above should fall within the range of more than 0.5 W-sec/cm$^2$ and less than 50 W-sec/cm$^2$ in order to achieve the partial pressure ratio given above.

BRIEF DESCRIPTION OF THE DRAWING

FIG. 1 schematically shows an apparatus used in practising a method of the present invention;

DETAILED DESCRIPTION OF THE PREFERRED EMBODIMENT

Figure 2:
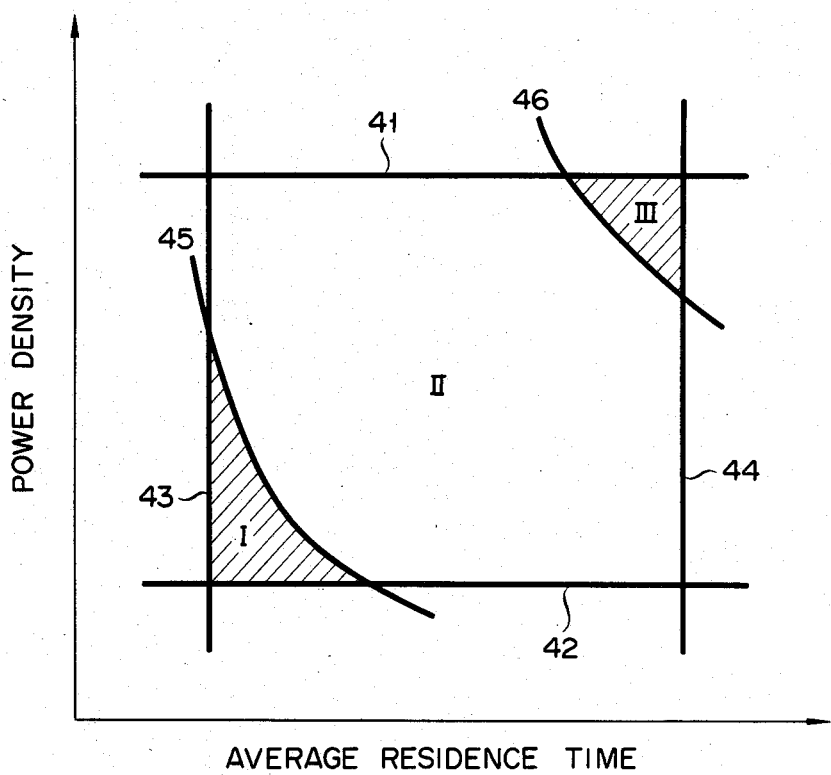
FIGS. 2 and 3 are graphs for explaining the conditions of the present invention for producing an optical information recording medium.

FIG. 1 schematically shows a sputtering apparatus used in practicing the present invention. An apparatus well-known in this field and available on the market can be used in the present invention. As seen from the drawing, the apparatus includes a vacuum chamber 10 defining a plasma-generating region 12. An electrode 14 connected to a high frequency power source 18 and a counterelectrode 16, which also acts as the holder of a substrate 22, are provided within the chamber 10. A metal target 20, which will be referred to later, is mounted on the electrode 14.

The vacuum chamber 10 is provided with an inlet port 24 of a plasma-generating gas, which is described later in detail, and the inlet port 24 is connected to a plasma-generating gas source 26. The chamber 10 is also provided with an evacuating port 28, which is connected via a pressure adjusting valve 30 to an evacuating means, e.g., an oil diffusion vacuum pump (not shown). It can be seen that the evacuating port 28 is opposite the inlet port 24. Further, the chamber 10 is provided with a port 32 which is connected to a partial pressure gauge 34, e.g., a quadrupole mass spectrometer. The gauge 34 serves to measure the partial pressure of the gas within the plasma-generating region 12.

In producing an optical information recording medium, the substrate 22 formed of a transparent organic resin such as acrylic resin or glass is mounted on the holder (or counterelectrode) 16. Also, the metal target 20 is mounted on the electrode 14. A metal capable of information recording by laser irradiation such as Te, antimony (Sb) or silver (Ag) is used for forming the target 20.

Then, the chamber 10 is evacuated into a vacuum of about $10^{-6}$ Torr by the evacuating means, and the plasma-generating gas is introduced from the gas source 26 into the chamber 10 via the gas inlet port 24. The plasma-generating gas comprises a decomposable gas of hydrocarbon, preferably, methane and ethane, particularly, methane. The plasma-generating gas may contain an additional gas including a rare gas such as argon, and ammonia, though the partial pressure of the additional gas should be not higher than that of the hydrocarbon. Where different kinds of gases are introduced into the chamber 10, the gas sources of the different gases are connected to the inlet port 24. A suitable flow rate of the plasma-generating gas ranges between 1 and 200 cc/min. It is desirable to control the pressure adjusting valve 30 of the discharge system such that the pressure within the vacuum chamber 10 is held within the range on the order of $10^{-3}$ and $10^{-2}$ Torr by the plasma-generating gas introduced into the chamber 10. If the internal pressure of the chamber 10 is lower than $10^{-4}$ Torr in the initial stage of discharge, a stable discharge cannot be achieved. On the other hand, if the internal pressure mentioned is higher than 10 Torr, the plasma generated by the discharge fails to perform a stable sputtering function.

After adjustment of the internal pressure of the chamber 10 as desired, high frequency power is applied by the high frequency power source 18 across the metal target 20 and the counterelectrode 16 so as to perform discharge. As a result, the plasma-generating gas including the hydrocarbon is dissociated to form a plasma, leading to sputtering of the metal target 20. The sputtered target metal is deposited on the substrate 22 in the form of a thin film so as to provide a desired optical information recording medium. The resultant thin film contains the target metal and the carbon liberated from the hydrocarbon. Generally, hydrogen is also contained in the thin film formed on the substrate 22.

As described above, the hydrocarbon in the plasma-generating gas is dissociated (or decomposed) during discharge. Naturally, various active species such as ions and radicals are formed during the dissociation. Some of the active species contribute to the sputtering function, perform reaction with the target, and are accumulated on the substrate. It follows that the kinds, amounts and energies of the active species play a vital role in determining the recording-reproducing characteristics of the recording film and the deposition rate of the film on the substrate. The present inventors have found that the average residence time of the plasma-generating gas within the discharge region and the power density applied to the gas are the most important factors to be considered. The dissociation reaction is promoted in accordance with an increase in the average residence time and the power density mentioned above. The term "average residence time" used herein and in the appended claims is defined as follows:

$$ART = (X/760) \times (Y/Z) \quad (1)$$

where: ART is the average residence time in seconds; X is the internal pressure (Torr) of the vacuum chamber in the discharge step; Y is the volume of the vacuum chamber in liters; and Z is the flow rate in Torr l/sec of the plasma-generating gas (160 sccm = 2 Torr l/sec.

Further, the term "power density" is defined by the equation $$\text{Power density} = \frac{\text{applied electric power } (W)}{\text{the area } (cm^2) \text{ of the target}} \quad (2)$$

Equation (1) indicates that when the flow rate Z of the plasma-generating gas is changed using the same apparatus (i.e., Y is constant) with the internal pressure X and the applied power kept constant, the ART of the plasma-generating gas is changed.

As a result of extensive research, the present inventors have found that it is possible to form a satisfactory recording film regardless of the type of the sputtering apparatus used if the product between the power density and the average residence time is set to fall within the range of more than 0.5 W-sec/$cm^2$ and less than 50 W-sec/$cm^2$, as described previously. It should be noted that the parameters involved in formula (1) can be determined regardless of the type of the sputtering apparatus used. Needless to say, the power density and the flow rate of the plasma-generating gas can be optionally set regardless of the type of the sputtering apparatus used. Also, the gas pressure, which may be changed by a change in the gas flow rate, can be set to be constant by adjusting the discharge rate of the gas. Further, the volume of the vacuum chamber is determined solely by the sputtering apparatus used and is usually about 100 liter. In short, the average residence time can be determined optionally as apparent from formulas (1) and (2). In the present invention, the product between the power density and the average residence time should desirably range between 1 and 40 W-sec/$cm^2$.

The present inventors have also found that the secondary hydrocarbons generated by the discharge from the hydrocarbon introduced into the plasma-generating region, discharge products, are composed mainly of acetylene and/or ethylene. It has also been found that a satisfactory recording film can be formed regardless of the type of the sputtering apparatus used, if the ratio of the partial pressure ($P_1$) of acetylene or ethylene present during discharge to that ($P_2$) of acetylene or ethylene detected (as a background) before discharge and after introduction of the initial hydrocarbon into the vacuum chamber to the predetermined pressure ranges between 2 and 12, preferably, between 3 and 10. The partial pressure $P_2$ is detected due to the nature of the high accuracy pressure detection device used such as quadrupole mass spectrometer and is used as a background value. It has also been found that the ratio mentioned can be achieved if the product between the power density and the average residence time is set as described previously, and vice versa. The desired partial pressure ratio can be achieved by controlling the gas flow rate such that the internal pressure of the vacuum chamber 10 is set to be constant after initiation of the discharge.

FIG. 2 is a graph showing the relationship between the power density and the average residence time of the gas within the vacuum chamber. Straight line 41 shown in FIG. 2 denotes the upper limit of the power density. Specifically, the upper limit mentioned should be about 5 W/$cm^2$. If the power density applied to the plasma-generating gas is higher than the upper limit mentioned, the substrate may be damaged by the heat generated by the discharge. Straight line 42 denotes the lower limit of the power density. Specifically, the lower limit of the power density should be about 0.01 W/$cm^2$. It is impossible to obtain a stable discharge if the power density is lower than the lower limit mentioned. Straight line 43 denotes the lower limit of the average residence time, which should be about 0.1 sec., as determined by the discharge capability of the vacuum pump, discharge pressure, etc. Further, straight line 44 denotes the upper limit of the average residence time, which should be about 100 sec, as determined by the discharge pressure.

The dissociation reaction does not proceed sufficiently within a shaded region I defined by the straight lines 42, 43 and a curve 45 because the average residence time of the gas is short and the power density applied to the gas is low within the shaded region I. In other words, the recording film-forming rate is markedly low within the shaded region I particularly in terms being commercial. Where the desired thickness of the recording film is 500 Å, the commercial film-forming rate should be at least 10 Å/min, preferably, 50 Å/min.

The dissociation reaction excessively proceeds within a shaded region III defined by the straight lines 41, 44 and a curve 46 because the average residence time of the gas is long and the power density applied to the gas is high within the region III. If the reaction is performed within the region III, it is certainly possible to obtain a high film-forming rate. But, the active species generated by the dissociation vigorously react with the recording film deposited on the substrate, resulting in a roughened surface of the formed film. It should be noted that a roughened surface leads to a low reflectance of the recording film. The reflectance, which is changed by, for example, the refractive index of the recording film, should desirably be set at about 40% or more. In the shaded region III shown in FIG. 2, it is impossible to achieve a reflectance of 40% or more. In the case of using hydrocarbon as the plasma-generating gas, the hydrocarbon is polymerized so rapidly within the region III that a recording film is not formed, but a powdery polymer is deposited on the substrate in some cases.

As apparent from the above description, a satisfactory recording medium (film) can be formed at a commercially satisfactory rate if the film-forming condition falls within a region II shown in FIG. 2, which is defined by the straight lines 41, 42, 43, 44 and the curves 45, 46. The range specified previously with respect to the product between the power density and the average residence time of the gas conforms with the region II shown in FIG. 2.

Figure 3:
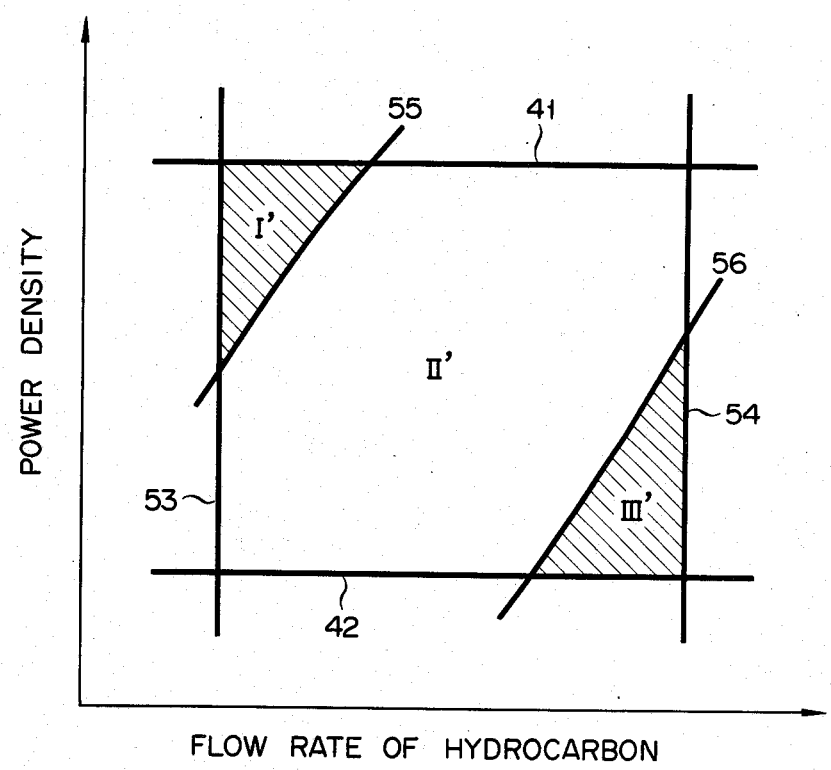

FIG. 3 is a graph showing the relationship between the power density and the flow rate of hydrocarbon gas. Naturally, the straight lines 41 and 42 denote the upper and lower limits of the power density as in FIG. 2. Straight line 53 denotes the lower limit of the hydrocarbon flow rate for maintaining the hydrocarbon pressure required for the discharge. Generally, the lower limit mentioned is about 1 to 10 cm$^3$/min. Straight line 54 denotes the upper limit of the hydrocarbon flow rate for maintaining the hydrocarbon pressure required for the discharge, which is generally about 100 to 500 cm$^3$/min. A shaded region I' defined by the straight lines 41, 53 and another straight line 55 corresponds in significance to the shaded region III shown in FIG. 2. Likewise, a shaded region III' defined by the straight lines 42, 54 and another straight line 56 corresponds in significance to the shaded region I shown in FIG. 2. Naturally, a region II' defined by all the straight lines mentioned above denotes a satisfactory region like the region II shown in FIG. 2.

EXAMPLE 1

Figure 4:
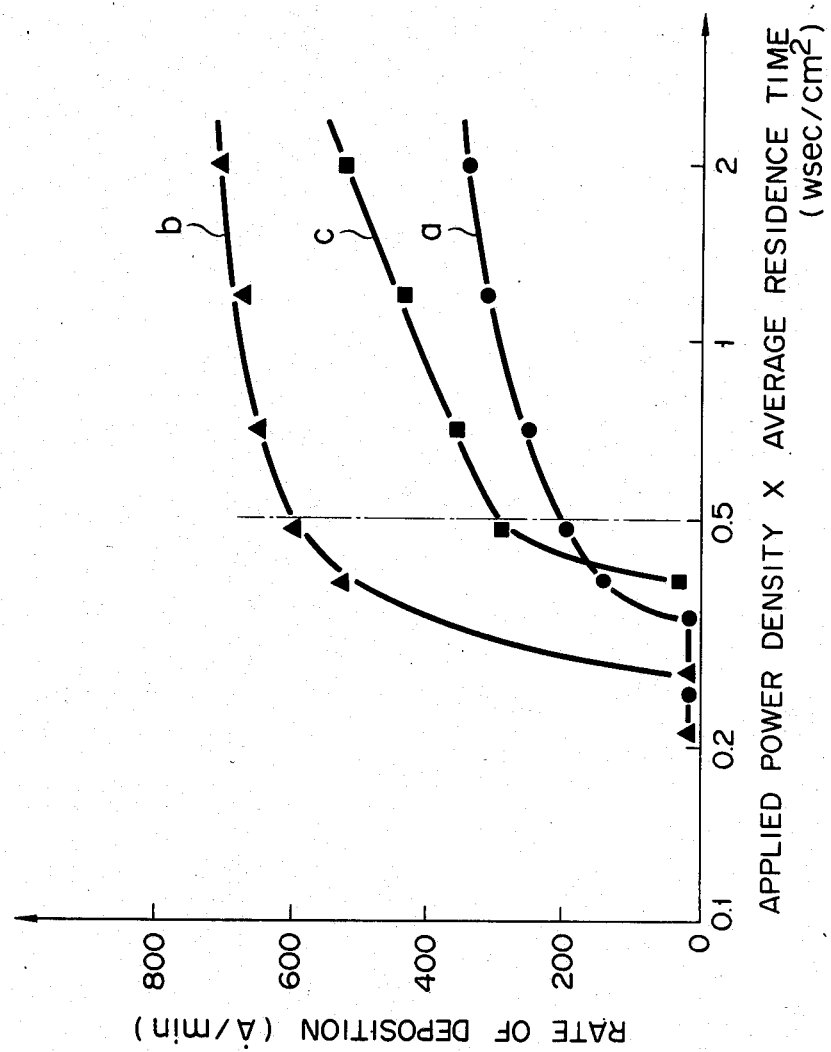
FIGS. 4 to 7 are graphs showing the effects of the present invention.

A methane gas was introduced into an RF dipolar sputtering apparatus (Model 8800 Sputtering System available from Material Research Corporation, the volume of the vacuum chamber: 110 liter) provided with a disc target formed of Te and having a diameter of 20 cm, the distance between the electrodes being 7 cm, so as to set the gas pressure within the apparatus at $2 \times 10^{-2}$ Torr. Curve a shown in FIG. 4 denotes the relationship between the recording film-forming rate and the value of W-sec/cm$^2$, i.e., the product between the power density applied to the methane gas and the average methane gas residence time within the vacuum chamber. In this experiment, the methane gas flow rate and the power density were changed in various fashions with the gas pressure within the apparatus kept at $2 \times 10^{-2}$ Torr. It is seen that the film-forming rate is markedly low where the product mentioned is smaller than 0.5 W-sec/cm$^2$. When it comes to the recording film formed under the condition that the product in question was greater than 0.5 W-sec/cm$^2$, the resultant recording medium was found capable of information recording by means of irradiation with a semiconductor laser beam (5 mW $\times$ 200 n sec). The ratio of $P_1$ and $P_2$ was 3 to 6. In addition, the modulating degree of the reproduced signal was found as high as 60%.

The Te content of the resultant recording film was measured by an inductive coupling plasma emission spectroscopy, the result being 60 atomic %. Likewise, the carbon content and hydrogen content of the recording film were measured by a combustion coulometric method and a mass spectrometry, respectively. The carbon content was found to be 20 atomic %. The hydrogen content was also found to be 20 atomic %.

EXAMPLE 2

A mixture of methane and ammonia gases was introduced into a DC planar magnetron sputtering apparatus (Model CFS-8EP available from Tokuda Seisakusho, Japan, the volume of the vacuum chamber: 100 l) provided with a disk target formed of Sb and having a diameter of 12 cm, so as to set the gas pressure within the apparatus at $5 \times 10^{-3}$ Torr. The partial pressure ratio of methane to ammonia was 5:1. The $P_1/P_2$ ratio was within a range of from 3 to 6. Curve b shown in FIG. 4 denotes the relationship between the film-forming rate and the value of W-sec/cm$^2$, i.e., the product between the power density applied to the gas mixture and the average residence time of the gas mixture. In this experiment, the flow rates of methane and ammonia as well as the applied power density were changed in various fashions, with the total pressure of the gases within the vacuum chamber kept at $5 \times 10^{-3}$ Torr. The recording medium comprising the recording film formed under the condition that the product in question was greater than 0.5 W-sec/cm$^2$ was found to exhibit satisfactory recording-reproducing characteristics.

EXAMPLE 3

A mixture of methane and argon gases was introduced into an RF planar magnetron sputtering apparatus (Model SMH-1300 available from Nippon Shinku Gijutsu K.K., Japan, the volume of the vacuum chamber: 120 liter) provided with a target formed of Ag and having a diameter of 15 cm, so as to set the pressure of the mixture within the apparatus at $6 \times 10^{-3}$ Torr. The partial pressure ratio of methane to argon was 4:1. The $P_1/P_2$ ratio was within a range of from 3 to 6. In this experiment, the flow rates of methane and argon as well as the applied power density were changed in various fashions, with the total pressure of the mixture within the apparatus kept at $5 \times 10^{-3}$ Torr. Curve c shown in FIG. 4 denotes the relationship between the film-forming rate and the product in question, i.e., the value of W-sec/cm$^2$. The recording medium comprising the recording film formed under the condition that the product in question was greater than 0.5 W-sec/cm$^2$, was found to exhibit satisfactory recording-reproducing characteristics.

EXAMPLE 4

Figure 5:
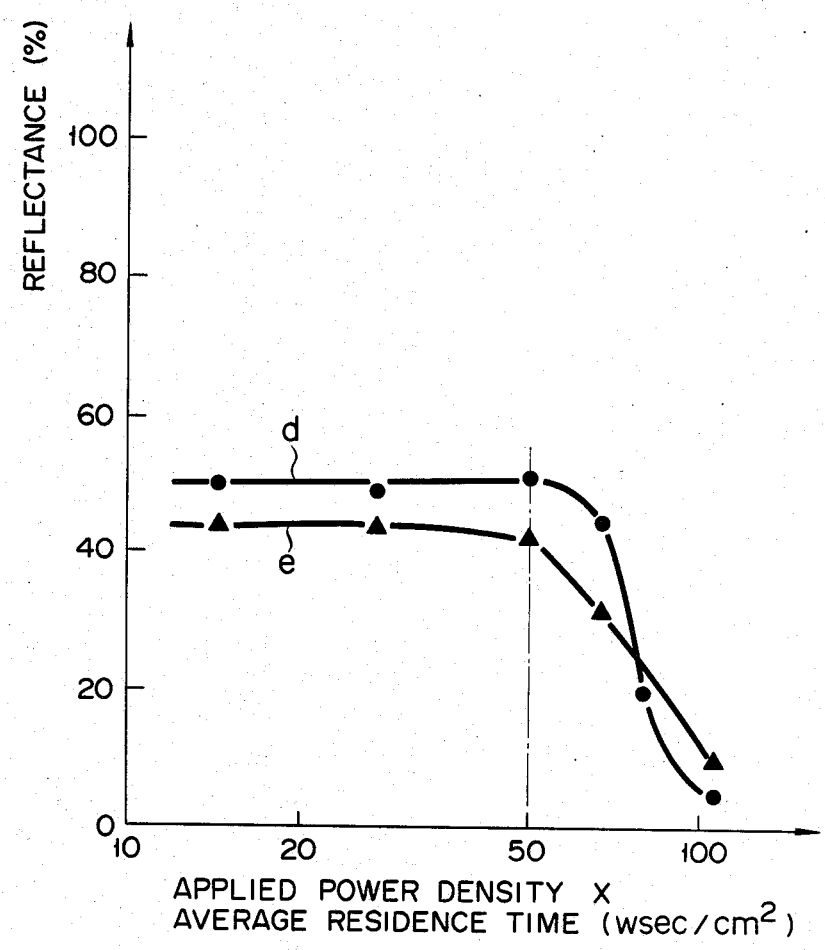

A methane gas was introduced into the sputtering apparatus used in Example 1 and provided with a disk target formed of Te and having a diameter of 20 cm, so as to set the methane pressure within the apparatus at $3 \times 10^{-2}$ Torr. A recording film 600 Å thick was formed on an acryl substrate 1.5 mm thick, with the methane flow rate and power density applied to the methane gas changed in various fashions. The $P_1/P_2$ ratio was within a range of from 3 to 6. Curve d in FIG. 5 shows the relationship between the reflectance with respect to a semiconductor laser beam having a wavelength of 8,300 Å and the product in question, i.e., the value of W-sec/cm$^2$. The surface of the resultant recording film was found roughened where the product between the applied power density and the average residence time of the methane gas was greater than 50 W-sec/cm$^2$. Specifically, the reflectance mentioned above was lower than about 40%. Also, a powdery polymer was found deposited on the substrate where the product in question was about 100 W-sec/cm$^2$.

EXAMPLE 5

A mixture of methane and argon gases was introduced into the sputtering apparatus used in Example 3 and provided with a target formed of Sb and having a diameter of 15 cm, so as to set the total pressure of the gases within the apparatus at $5 \times 10^{-3}$ Torr. The partial pressure ratio of methane to argon was 2:1. A recording film 500 Å thick was formed on an acryl substrate 1.5 mm thick, with the flow rate of the gases and the power density applied to the gases changed in various fashions. The $P_1/P_2$ ratio was within a range of from 3 to 6. Curve e in FIG. 5 shows the relationship between the reflectance of the resultant recording film measured as in Example 4 and the product in question, i.e., the value of W-sec/cm$^2$. The surface of the resultant film was found very smooth where the product in question was smaller than 50 W-sec/cm$^2$. Specifically, the reflectance mentioned was greater than 40%. Also, the recording medium comprising the recording film mentioned above was found to exhibit satisfactory recording-reproducing characteristics.

EXAMPLE 6

A methane gas was introduced into the sputtering apparatus used in Example 1 and provided with a disk Te target having a diameter of 20 cm, so as to set the methane pressure within the apparatus at $2 \times 10^{-2}$ Torr. In this experiment, the power density applied to the methane gas was changed in various fashions, with the methane flow rate set to be constant.

Figure 6:
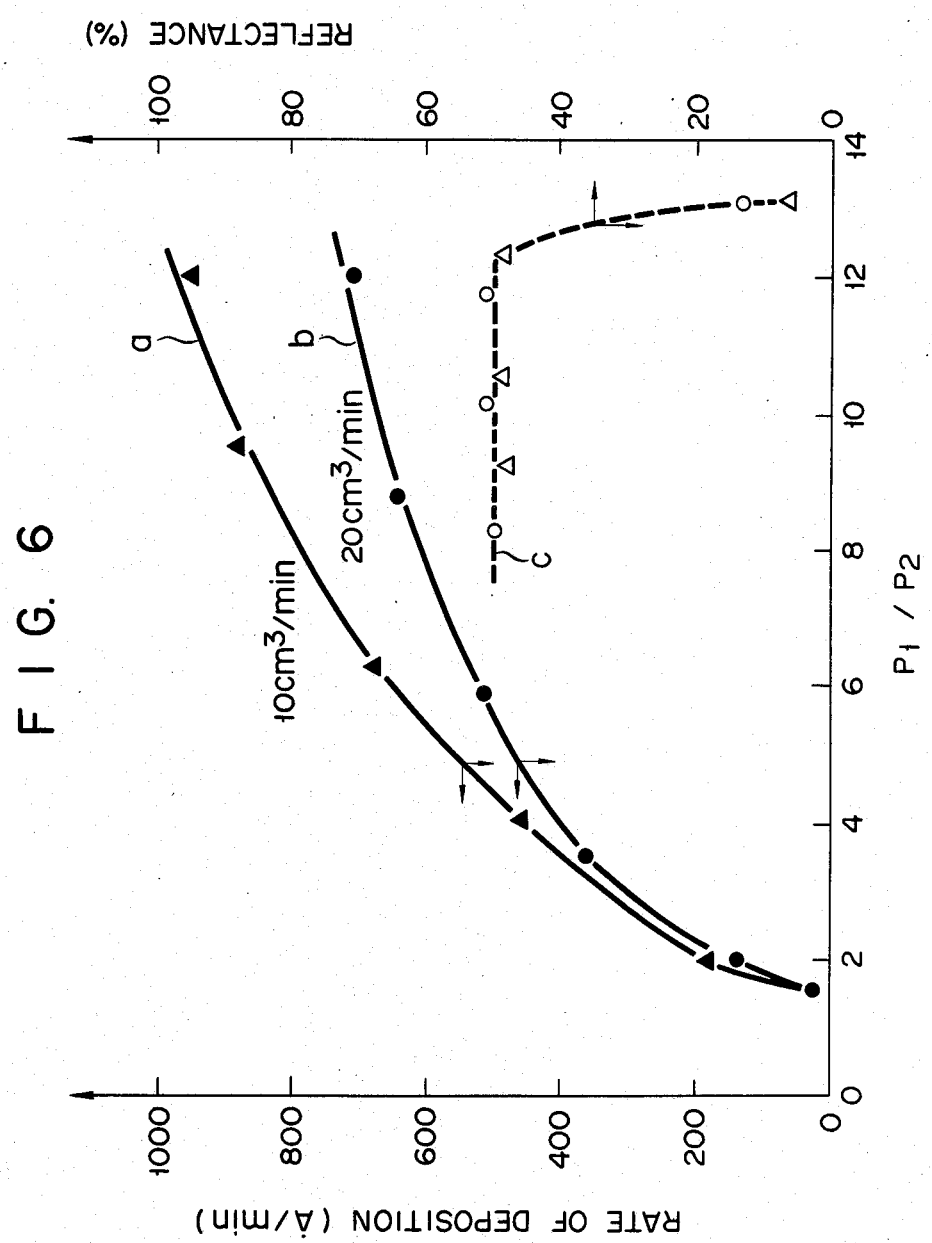

Partial pressure $P_2$ of $C_2H_2$ during introduction of $CH_4$ to a pressure of $2 \times 10^{-2}$ Torr and before the discharge step and partial pressure $P_1$ of $C_2H_2$ in the film-forming step were measured using a quadrupole mass spectrometer. The $P_2$ was measured as a background value for the partial pressure of $C_2H_2$. FIG. 6 shows the relationship between the film-forming rate and the value of $P_1/P_2$. Curves a and b in FIG. 6 denote the cases where the methane flow rate was 10 cm$^3$/min and 20 cm$^3$/min, respectively. Acetylene ($C_2H_2$) was formed soon after the initiation of discharge as seen from the increase in the value of $P_1/P_2$. Also, a high film-forming rate was recognized after the value of $P_1/P_2$ exceeded 2. A further increase in the value of $P_1/P_2$ as well as in the film-forming rate were recognized in accordance with increase in the power applied to the gas.

Curve c in FIG. 6 denotes the relationship between the reflectance of the information recording medium produced by the method of the present invention and the $P_1/P_2$ ratio employed in the manufacturing step of the recording film. The reflectance, which may be changed depending on the refractive index, etc. of the recording film, should desirably be set at about 40% or more. In this experiment, a recording film 600 Å thick was formed on an acryl substrate 1.5 mm thick. A semiconductor laser beam having a wavelength of 8,300 Å was used for measuring the reflectance as in Example 4. FIG. 6 shows that the reflectance is rapidly dropped if the $P_1/P_2$ ratio is greater than 12, indicating that the surface of the formed film is severely roughened. When it comes to the recording medium formed under the condition that the $P_1/P_2$ ratio ranges between 2 and 12, the produced recording medium was found capable of signal recording by means of a semiconductor laser beam irradiation (5 mW $\times$ 200 n sec). Also, the modulating degree of the reproduced signal was found as high as 60%.

EXAMPLE 7

Figure 7:
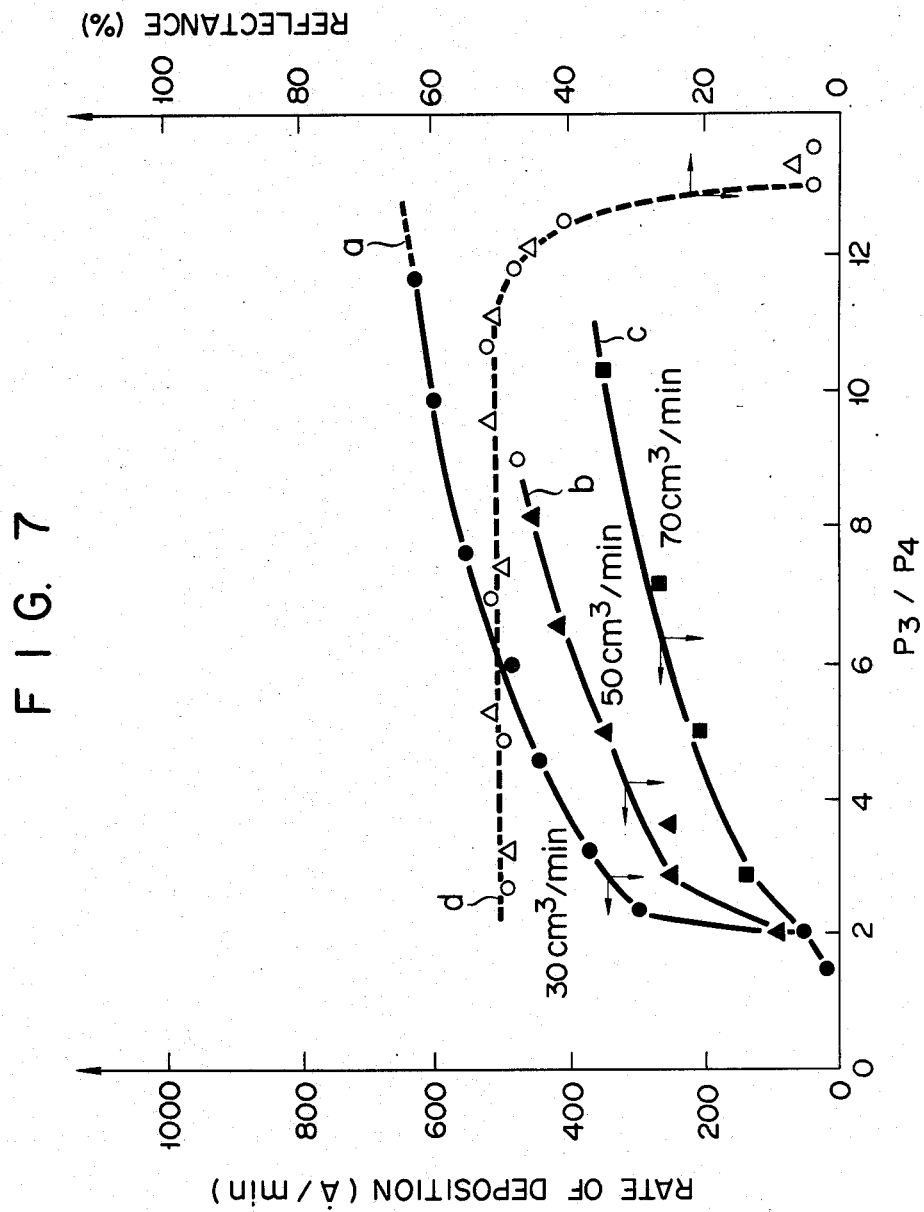

A recording film was formed by sputtering a Te target with a methane plasma as in Example 6. The gas pressure in the discharge step was $2 \times 10^{-2}$ Torr. Partial pressure $P_4$ of $C_2H_4$ after the introduction of methane and before the discharge step and partial pressure $P_3$ of $C_2H_4$ in the film-forming step were measured using the pressure gauge. The $P_4$ was measured as a background value for the partial pressure of $C_2H_4$. FIG. 7 shows the relationship between the film-forming rate and the $P_3/P_4$ ratio. Curves a, b and c shown in FIG. 7 cover the cases where the methane flow rate was 30 cm$^3$/min, 50 cm$^3$/min and 70 cm$^3$/min, respectively. The introduced methane was dissociated to form ethylene ($C_2H_4$) immediately after initiation of discharge as seen from the increase in the $P_3/P_4$ ratio. FIG. 7 shows that the film-forming rate was well over 100 Å/min if the $P_3/P_4$ ratio was greater than 2. A further increase in the $P_3/P_4$ ratio as well as the film-forming rate was recognized in accordance with an increase in the power applied to the gas. It should also be noted that the $P_1/P_2$ partial pressure ratio, i.e., the ratio of acetylene ($C_2H_2$) to methane, was found greater than 2 where the $P_3/P_4$ ratio in question was greater than 2. Likewise, the $P_1/P_2$ ratio was found smaller than 12 where the $P_3/P_4$ ratio was smaller than 12.

Curve d in FIG. 7 denotes the relationship between the reflectance and the $P_3/P_4$ ratio of the recording medium produced by the method of the present invention. In this experiment, a recording film 600 Å thick was formed on an acryl substrate 1.5 mm thick. The reflectance was measured by using a semiconductor laser beam having a wavelength of 8,300 Å. It is seen that the reflectance is rapidly decreased if the $P_3/P_4$ ratio is greater than 12, indicating a severe roughening of the surface of the formed film.

EXAMPLE 8

A mixture of methane and argon gases was introduced into the sputtering apparatus used in Example 3 and provided with a disk Ag target having a diameter of 15 cm so as to set the gas pressure within the apparatus at $5 \times 10^{-3}$ Torr. The partial pressure ratio of methane to argon was 3:1. In this experiment, the flow rate of the gas mixture was set to be constant at 10 cm$^3$/min, with the power density applied to the gas mixture changed in various fashions within the range of 0.01 and 0.5 W/cm$^2$. The partial pressure ratio of $P_1$, i.e., the partial pressure of $C_2H_2$ formed in the film-forming step, to $P_2$, or the partial pressure of $CH_4$ introduced into the apparatus, was measured in the film-forming step. The film-forming rate was found as high as 150 Å/min where the $P_1/P_2$ ratio was 2 in contrast to only 20 Å/min where the $P_1/P_2$ ratio was 1.8.

EXAMPLE 9

Ethane ($C_2H_6$) was introduced into the sputtering apparatus used in Example 2 and provided with a disk Sb target having a diameter of 12 cm so as to set the ethane pressure within the apparatus at $5 \times 10^{-3}$ Torr. In this experiment, the ethane flow rate was set to be constant at 5 cm$^3$/min, with the power density applied to the ethane changed in various fashions within the range of 0.5 to 1 W/cm$^2$. The partial pressures $P_3$ and $P_4$ of $C_2H_4$ before and after discharge were measured. It has been found that, where the ratio of $P_3/P_4$ is smaller than 12, the recording film formed has a smooth surface, exhibits a recording sensitivity of 5 m-W$\times$250 n sec, and performs a modulating degree of 50%. Where the $P_3/P_4$ ratio was 15, however, a recording film was not formed, but a black powdery polymer was deposited on the substrate. It should also be noted that, where the $P_3/P_4$ ratio was smaller than 12, the partial pressure ratio of acetylene formed by discharge to the pressure of ethane introduced into the apparatus was also found smaller than 12.

As described above in detail, hydrocarbon is used as the plasma-generating gas, which has heretofore been in controlling its dissociation process, in the method of the present invention. Nevertheless, the present invention permits producing an optical information recording medium exhibiting satisfactory surface smoothness and light reflectance regardless of the type of sputtering apparatus used. What should also be noted is that the recording film formed by the method of the present invention contains carbon and hydrogen in addition to the sputtered metal, with the result that the recording film is not deteriorated by the oxygen or water contained in the air or by ultraviolet light. It follows that the optical information recording medium produced by the method of the present invention is capable of reproducing the recorded information quite satisfactorily.

What is claimed is:

1. A method of producing an optical information recording medium, comprising the sequential steps of:
    introducing a plasma-generating gas comprising a first hydrocarbon into a plasma-generating region provided with a metal target on a first electrode and a substrate on a second electrode;
    measuring said plasma-generating gas by means of a quadrupole mass spectrometer;
    converting during said measurement of said plasma-generating secondary hydrocarbon;
    maintaining the pressure of the plasma-generating gas within a predeterminerd range within the plasma-generating region;
    applying electric power to said first electrode so as to dissociate the plasma-generating gas, thereby forming a plasma;
    measuring the partial pressure of said secondary hydrocarbon by mean of a quadrupole mass spectrometer;
    controlling the product between the density of the power applied to said first electrode and the average residence time of the plasma-generating gas within the plasma-generating region such that said product falls within the range of more than 0.5 W-sec/cm$^2$ and less than 50 W-sec/cm$^2$; and
    sputtering the metal target with the plasma so as to allow the sputtered metal to be deposited on the substrate in the form of a film, said film containing carbon liberated from the hydrocarbon;
    wherein the partial pressure ratio of said secondary hydrocarbon, which is different from the introduced hydrocarbon, present during the dissociation to the secondary hydrocarbon before the dissociation and after said introduction is set to range between 2 and 12.

2. The method according to claim 1, wherein the metal target is formed of at least one metal selected from the group consisting of tellurium, antimony and silver.

3. The method according to claim 1, wherein the hydrocarbon contained in the plasma-generating gas is methane.

4. The method according to claim 1, wherein the plasma-generating gas further contains a rare gas.

5. The method according to claim 1, wherein the plasma-generating gas further contains ammonia.

6. The method according to claim 1, wherein the plasma-generating gas is introduced into the plamsa-generating region at the rate of 1 to 200 cc/min.

7. The method according to claim 1, wherein the power density ranges between 0.01 and 5 W/cm$^2$.

8. The method according to claim 1, wherein the average residence time ranges between 0.1 second and 100 seconds.

9. The method according to claim 1, wherein the pressure of the plasma-generating gas within the plasma-generating region is on the order of $10^{-3}$ Torr and $10^{-2}$ Torr.

10. A method of producing an optical information recording medium, comprising the steps of:
    introducing a plasma-generating gas comprising methane into a plasma-generating region provided with a metal target on a first electrode and a substrate on a second electrode;
    measuring said plasma-generating gas by means of a quadrupole mass spectrometer;
    converting during said measurement of said plasma-generating gas some of said methane into ethylene;
    maintaining the pressure of the plasma-generating gas within a predetermined range within the plasma-generating region;
    applying electric power to said first electrode so as to dissociate the plasma-generating gas, thereby forming a plasma;
    measuring the partial pressure of said ethylene by means of a quadrupole mass spectrometer;
    controlling the product between the density of the power applied to said first electrode and the average residence time of the plasma-generating gas within the plasma-generating region such that said product falls within the range of more than 0.5 W-sec/cm$^2$ 0.005 and less than 50 W-sec/cm$^2$; and sputtering the metal target with the plasma so as to allow the sputtered metal to be deposited on the substrate in the form of a film, said film containing carbon liberated from the methane;

wherein the partial pressure ratio of ethylene present during the dissociation to the ethylene before the dissociation and after said introduction is set to range between 2 and 12.

11. The method according to claim 10, wherein the metal target is formed of at least one metal selected from the group consisting of tellurium, antimmony and silver.

12. The method according to claim 10, wherein the plasma-generating gas further contains a rare gas.

13. The method according to claim 10, wherein the plasma-generating gas further contains ammonia.

14. The method according to claim 1, wherein the plasma-generating gas is introduced into the plasma-generating region at the rate of 1 to 200 cc/min.

15. The method according to claim 10, wherein the power density ranges between 0.01 and 5 W/cm$^2$.

16. The method according to claim 10, wherein the average residence time ranges between 0.1 second and 100 seconds.

17. The method according to claim 10, wherein the pressure of the plasma-generating gas within the plasma-generating region is on the order of $10^{-3}$ Torr and $10^{-2}$ Torr.

* * * * *